US012805084B2

(12) United States Patent
Sun et al.

(10) Patent No.: US 12,805,084 B2
(45) Date of Patent: Nov. 17, 2026

(54) DISPLAY MODULE AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Liang Sun, Wuhan (CN); Mian Zeng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 865 days.

(21) Appl. No.: 18/194,509

(22) Filed: Mar. 31, 2023

(65) Prior Publication Data

US 2024/0258479 A1 Aug. 1, 2024

(30) Foreign Application Priority Data

Jan. 31, 2023 (CN) ......................... 202310099009.1

(51) Int. Cl.

| | |
|---|---|
| ***H01L 33/62*** | (2010.01) |
| ***G09G 3/32*** | (2016.01) |
| ***H10D 86/40*** | (2025.01) |
| ***H10D 86/60*** | (2025.01) |

(Continued)

(52) U.S. Cl.
CPC ............ *H10H 20/857* (2025.01); *G09G 3/32* (2013.01); *H10D 86/441* (2025.01); *H10D 86/60* (2025.01); *H10W 90/00* (2026.01); *G09G 2310/0267* (2013.01)

(58) Field of Classification Search
CPC .... H10H 20/857; H10D 86/441; H10D 86/60; H10W 90/00; G09G 3/32
See application file for complete search history.

(56) References Cited

U.S. PATENT DOCUMENTS

| | | | | |
|---|---|---|---|---|
| 11,994,771 | B1 * | 5/2024 | Dai | G02F 1/133612 |
| 2002/0140646 | A1 | 10/2002 | Sato et al. | |

(Continued)

FOREIGN PATENT DOCUMENTS

| | | | |
|---|---|---|---|
| CN | 209016060 | U | 6/2019 |
| CN | 114975403 | A | 8/2022 |
| CN | 115207054 | A | 10/2022 |

OTHER PUBLICATIONS

Chinese Office Action issued in corresponding Chinese Patent Application No. 202310099009.1 dated Apr. 23, 2026, pp. 1-6.

*Primary Examiner* — William C Trapanese
(74) *Attorney, Agent, or Firm* — PV IP PC; Peter Stecher; Wei Te Chung

(57) ABSTRACT

A display module and a display panel are provided. The display module includes a first substrate, a first pixel-driving circuit module, a light-emitting module, a first packaging structure, and a first terminal module. The first pixel-driving circuit module includes at least one first pixel-driving circuit. The first terminal module includes at least one first terminal group corresponding to the first pixel-driving circuit. The first terminal group is provided with plurality of first via holes. The plurality of first terminals are electrically connected with the first pixel-driving circuit through the plurality of first via holes.

19 Claims, 8 Drawing Sheets

(51) Int. Cl.
*H10H 20/857* (2025.01)
*H10W 90/00* (2026.01)

(56) References Cited

U.S. PATENT DOCUMENTS

| | | | | |
|---|---|---|---|---|
| 2015/0311417 | A1* | 10/2015 | Horikawa | H10H 20/8582 257/98 |
| 2021/0066354 | A1 | 3/2021 | Chen et al. | |
| 2021/0068266 | A1* | 3/2021 | Isobe | G09F 9/30 |
| 2022/0115572 | A1* | 4/2022 | Yang | H10H 20/857 |
| 2022/0165755 | A1* | 5/2022 | Hsieh | H10D 86/441 |
| 2022/0271208 | A1* | 8/2022 | Li | H10H 20/857 |
| 2023/0005970 | A1* | 1/2023 | Chen | H10D 86/0214 |
| 2023/0320146 | A1* | 10/2023 | Sun | H10K 59/1201 257/40 |

* cited by examiner

DISPLAY MODULE AND DISPLAY PANEL

TECHNICAL FIELD

The present application relates to a field of display technologies, and specifically relates to a display module and a display panel.

BACKGROUND

Display panels generally include pixel units for performing a display function and pixel-driving circuits for driving the pixel units.

In existing display panels, the pixel-driving circuits are generally integrated into a drive circuit layer on a substrate. The pixel-driving circuits may not be disposed on the substrate as a separate module, so that the display panels with different pixel densities need to correspond to different mold opening processes, resulting in higher development cost of the display panels.

SUMMARY

The present application provides a display module and a display panel, the pixel-driving circuits are modularized in a unit of the display module, thereby effectively reducing development cost of the display panel.

In a first aspect, the present application provides a display module, including: a first substrate provided with a plurality of first via holes; a first pixel-driving circuit module disposed on a side of the first substrate, and including at least one first pixel-driving circuit; a light-emitting module disposed on a side of the first pixel-driving circuit module away from the first substrate, and including at least one light-emitting unit corresponding to the first pixel-driving circuit; a first packaging structure disposed on a side of the first substrate facing the first pixel-driving circuit module, and covering the first pixel-driving circuit module and the light-emitting module; and a first terminal module disposed on a side of the first substrate away from the first pixel-driving circuit module, and including at least one first terminal group corresponding to the first pixel-driving circuit; the first terminal group includes a plurality of first terminals electrically connected with the first pixel-driving circuit through the plurality of first via holes.

In an embodiment, in the first terminal group, connecting lines between a center of one of the plurality of first terminals and centers of other two of the plurality of first terminals are parallel to a first direction and a second direction respectively, and the first direction is perpendicular to the second direction.

In an embodiment, in the first terminal group, the plurality of first terminals include a data line terminal, a scanning line terminal, a first power signal terminal, and a second power signal terminal; in the first terminal group, the connecting line from a center of the first power signal terminal to a center of the data line terminal is parallel to the first direction; and the connecting line from the center of the first power signal terminal to a center of the second power signal terminal is parallel to the second direction.

In an embodiment, the first pixel-driving circuit module includes a plurality of first pixel-driving circuits, and the first terminal module includes a plurality of first terminal groups corresponding to the plurality of first pixel-driving circuits; an arrangement of any kind of the plurality of first terminals in the plurality of first terminal groups is same as an arrangement of the plurality of first pixel-driving circuits.

In an embodiment, the first pixel-driving circuit module includes a plurality of first pixel-driving circuits, and the first terminal module includes a plurality of first terminal groups corresponding to the plurality of first pixel-driving circuits; an arrangement of any kind of the plurality of first terminals in the plurality of first terminal groups is different from an arrangement of the plurality of first pixel-driving circuits.

In an embodiment, the light-emitting module includes a plurality of light-emitting units arranged at intervals along a same direction and having different light-emitting colors, and the plurality of light-emitting units arranged at intervals along the same direction and having different light-emitting colors are respectively electrically connected to the plurality of first pixel-driving circuits arranged at intervals along the same direction; the plurality of first terminal groups corresponding to the plurality of first pixel-driving circuits arranged at intervals along the same direction share at least one of the plurality of first terminals.

In an embodiment, the plurality of first terminal groups corresponding to the plurality of first pixel-driving circuits arranged at intervals along the same direction share one scanning line terminal, one first power signal terminal, and one second power signal terminal.

In an embodiment, an arrangement of data line terminals in each of the plurality of first terminal groups is same as an arrangement of the plurality of first pixel-driving circuits.

In an embodiment, the display module further including: a second substrate provided with a plurality of second via holes; a second pixel-driving circuit module disposed on a side of the second substrate, and including at least one second pixel-driving circuit; a second packaging structure disposed on a side of the second substrate facing the second pixel-driving circuit module, and covering the second pixel-driving circuit module; and a second terminal module disposed on a side of the second substrate away from the second pixel-driving circuit module, and including at least one second terminal group corresponding to the second pixel-driving circuit; the second terminal group includes a plurality of second terminals electrically connected with the second pixel-driving circuit through the plurality of second via holes; the first pixel-driving circuit corresponds to the second pixel-driving circuit, and the first pixel-driving circuit and the second pixel-driving circuit correspondingly disposed are configured to driving the light-emitting unit.

In an embodiment, in the display module, a number of the first-pixel driving circuit, a number of the second pixel driving circuit, and a number of the light-emitting unit are all one.

In an embodiment, a driving mode of the first pixel-driving circuit is pulse amplitude modulation, and a driving mode of the second pixel-driving circuit is pulse width modulation.

In another aspect, the present application provides a display panel provided with a display area and a non-display area, the display area includes a driving backplate and a plurality of display modules above-mentioned, the plurality of display modules are disposed on a side of the driving backplate and located in the display area; the driving backplate includes: a substrate; and a wiring layer disposed on a side of the substrate; the plurality of display modules are disposed on a side of the wiring layer away from the substrate; the wiring layer includes a plurality of first wirings electrically connected with the first pixel-driving circuit through the plurality of first terminals; and a thickness of the wiring layer is larger than or equal to 10 μm.

In an embodiment, the display further includes a plurality of gate driving modules arranged on a side of the driving backplate facing the plurality of display modules in array and located in the non-display area; the plurality of gate driving modules include: a third substrate, provided with a plurality of third via holes; a gate driving circuit module disposed on a side of the third substrate, and including at least one gate driving circuit; a third packaging structure disposed on a side of the third substrate facing the gate driving circuit module, and covering the gate driving circuit module; and a third terminal module disposed on a side of the third substrate away from the gate driving circuit module, and including at least one third terminal group corresponding with the gate driving circuit; the third terminal group comprises a plurality of third terminals electrically connected with the gate driving circuit through the plurality of third via holes.

In an embodiment, in the first terminal group, connecting lines from a center of one of the plurality of third terminals and centers of other two of the plurality of third terminals are parallel to a first direction and a second direction respectively, and the first direction is perpendicular to the second direction.

In an embodiment, the plurality of third terminals in the third terminal group include a clock signal terminal, a first scanning signal terminal, a second signal terminal, a VGH signal terminal, and a VGL signal terminal; in the third terminal group, a connecting line from a center of the clock signal terminal to a center of the VGH signal terminal and a center of the VGL signal terminal is parallel to the second direction; and a connecting line from the center of the clock signal terminal to a center of the first scanning signal terminal is parallel to the first direction.

In an embodiment, the gate driving circuit module includes a plurality of gate driving circuits; the third terminal module includes a plurality of third terminal groups; and an arrangement of any kind of the plurality of third terminals in the plurality of third terminal groups is same as an arrangement of a plurality of gate driving circuit modules.

In an embodiment, the gate driving circuit module includes a plurality of gate driving circuits, and the third terminal module includes a plurality of third terminal groups corresponding to the plurality of gate driving circuits; an arrangement of at least one kind of the plurality of third terminals in the plurality of third terminal groups is different from an arrangement of a plurality of gate driving circuit modules.

In an embodiment, the plurality of gate driving circuits corresponding to the plurality of third terminal groups along a same direction share at least one kind of the plurality of third terminals.

In an embodiment, the plurality of gate driving circuits corresponding to the plurality of third terminal groups along a same direction share one clock signal terminal, one VGH signal terminal, and one VGL signal terminal.

In an embodiment, the wiring layer further includes a plurality of second wirings, and the plurality of second wirings are connected to the of gate drive circuits through the plurality of third terminals.

The present application provides the display module and the display panel. The display module includes the first substrate, the first pixel-driving circuit module, the light-emitting module, and the first packaging structure. The first pixel-driving circuit module is disposed on the side of the first substrate, and including at least one first pixel-driving circuit. The light-emitting module disposed on the side of the first pixel-driving circuit module away from the first substrate, and including at least one light-emitting unit corresponding to the first pixel-driving circuit. The first packaging structure disposed on the side of the first substrate facing the first pixel-driving circuit module, and covering the first pixel-driving circuit module and the light-emitting module. The display module further includes the first terminal module. The first terminal module disposed on the side of the first substrate away from the first pixel-driving circuit module, and including at least one first terminal group corresponding to the first pixel-driving circuit. The first terminal group includes a plurality of first terminals. The first substrate is provided with the plurality of first via holes, and the plurality of first terminals in the first terminal group are electrically connected with the first pixel-driving circuit through the plurality of first via holes. In the present application, by taking the display module as a unit, the pixel-driving circuit as an independent unit may be freely disposed in any area of the display area of the display panel, thereby greatly reducing development cost of the display panel.

DESCRIPTION OF DRAWINGS

To describe technical solutions of embodiments of the present application more clearly, the following briefly introduces accompanying drawings used in a description of the embodiments of the present disclosure. Apparently, the accompanying drawings described below illustrate only some exemplary embodiments of the present application, and persons skilled in the art may derive other drawings from the drawings without making creative efforts.

DESCRIPTION OF ATTACHED DRAWINGS

Figure 1:
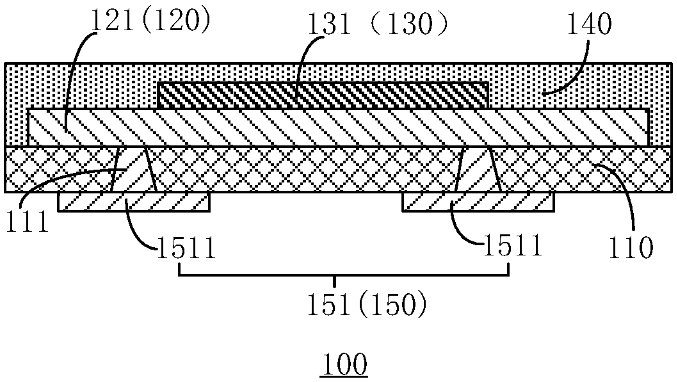
FIG. 1 is a schematic diagram of a film structure of a display module in a first embodiment of the present application.

10, display panel; AA, display area; NAA, non-display area; 100, display module; 110, first substrate; 111, first via hole; 120, first pixel-driving circuit module; 121, first pixel-driving circuit; 130, light-emitting module; 131, light-emitting unit; 140, first packaging structure; 150, first terminal module; 151, first terminal group; 1511, first terminal; 1511-A, data line terminal; 1511-B, scanning line terminal; 1511-C, first power signal terminal; 1511-D, second power signal terminal; X, first direction; Y, second direction; 115*a*, first metal layer; 110*a*, first buffer layer; 110*b*, first substrate layer; 110*c*, first barrier layer; 110*d*, second substrate layer; 110*e*, second barrier layer; 120*a*, shading metal layer; 120*b*, second buffer layer; 120*c*, semiconductor layer; 120*d*, first gate insulation layer; 120*e*, first gate layer; 120*f*, second gate insulation layer; 120*g*, second gate layer; 120*h*, interlayer insulation layer; 120*i*, first source-drain metal layer; 120*j*, first flat layer; 120*k*, second source-drain metal layer; 120*m*, second flat layer; 120*n*, electrode layer; 120*o*, protective layer; 130*a*, pad layer; 130*b*, light-emitting function layer; 200, driving backplate; 210, substrate; 220, wiring layer; 300, sealing structure layer; 160, second substrate; 161, second via hole; 170, second pixel-driving circuit module; 171, second pixel-driving circuit; 180, second packaging structure; 190, second terminal module; 191, second terminal group; 1911, second terminal; 400, gate driving module; 410, third substrate; 411, third via hole; 420, gate driving circuit module; 421, gate driving circuit; 430, third packaging structure; 440, third terminal module; 441, third terminal group; 4411, third terminal; 4411-A, clock signal terminal; 4411-B, first scanning signal terminal; 4411-C, second signal terminal; 4411-D, VGH signal terminal; 4411-E, VGL signal terminal.

DETAILED DESCRIPTION OF EMBODIMENTS

The technical solutions in embodiments of the present application will be described clearly and completely hereafter with reference to the accompanying drawings. Apparently, described embodiments are only a part of but not all embodiments of the present application. All other embodiments obtained by persons of ordinary skill in the art based on the embodiments of the present disclosure without creative efforts shall fall within a protection scope of the present application. In addition, it should be understood that specific embodiments described herein are merely for explaining the present application, the term "embodiment" used in a context means an example, instance, or illustration, and the present application is not limited thereto. In the present application, location terms such as "up" and "down" are used in general to refer to up and down in actual use or operation of a device, in particular drawing directions in the drawings, without description to the contrary. While "inside" and "outside" are for the outline of the device.

Various embodiments and examples are provided in the following description to implement different structures of the present application. In order to simplify the present application, certain elements and settings will be described. However, these elements and settings are only by way of example and are not intended to limit the present application. In addition, reference numerals may be repeated in different examples in the present application. This repeating is for the purpose of simplification and clarity and does not refer to relations between different embodiments and/or settings. Furthermore, examples of different processes and materials are provided in the present application. However, it would be appreciated by those skilled in the art that other processes and/or materials may be also applied. Detailed description will be given separately below and it should be noted that the order of description of the following embodiments is not limited to the preferred order of the embodiments.

Embodiment 1

FIG. 1 is a schematic diagram of a film structure of a display module in a first embodiment of the present application. Referring to FIG. 1, in a first aspect, the first embodiment of the present application provides a display module 100. The display module 100 includes a first substrate 110, a first pixel-driving circuit module 120, a light-emitting module 130, and a first packaging structure 140. The first pixel-driving circuit module 120 is disposed on a side of the first substrate 110, and including at least one first pixel-driving circuit 121. The light-emitting module 130 is disposed on a side of the first pixel-driving circuit module 120 away from the first substrate 110, and including at least one light-emitting unit 131 corresponding to the first pixel-driving circuit 121. The first packaging structure 140 is disposed on a side of the first substrate 110 facing the first pixel-driving circuit module 120, and covering the first pixel-driving circuit module 120 and the light-emitting module 130. The display module 100 further includes a first terminal module 150. The first terminal module 150 is disposed on a side of the first substrate 110 away from the first pixel-driving circuit module 120, and including at least one first terminal group 151. The first terminal group 151 corresponds to the first pixel-driving circuit 121. The first terminal group 151 is provided with a plurality of first terminals 1511. The first substrate 110 includes a plurality of first via holes 111. The plurality of first terminals 1511 in the first terminal group 151 are electrically connected with the first pixel-driving circuit 121 through the plurality of first via holes 111.

When the display module 100 provided by the present application is applied in a display panel 10, since the first terminals 1511 electrically connected with the first pixel-driving circuit 121 are disposed on the side of the first substrate 110 away from the first pixel-driving circuit 121. Therefore, bonding positions of the display module 100 in the display panel 10 may be freely selected according to actual needs, so that the first pixel-driving circuit 121 may be freely disposed on any area of a display area AA of the display panel 10 by taking the display module 100 as a unit, thereby greatly reducing development cost of the display panel 10 and improving design freedom of the display panel 10.

Furthermore, in the display module 100 provided by the first embodiment of the present application, a number of the first pixel-driving circuit 121 in the first pixel-driving circuit module 120 is one, a number of the light-emitting unit 131 in the light-emitting module 130 is one, and a number of the first terminal group 151 in the first terminal module 150 is one. Since in the display module 100 of this structure, the number of the first pixel-driving circuit 121, the number of the light-emitting unit 131, and the number of the first terminal group 151 are all one, so the design freedom of the display panel 10 including a quality of display modules 100 may be maximized.

Figure 2:
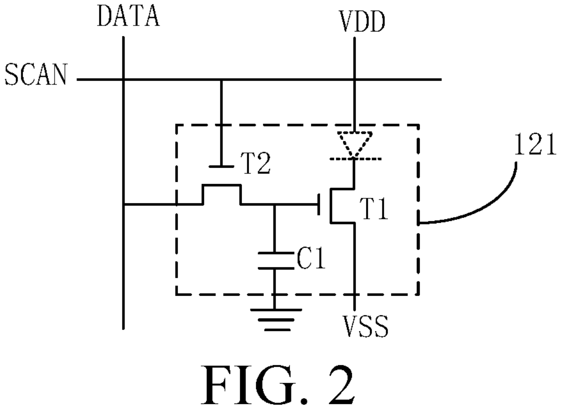
FIG. 2 is an equivalent circuit diagram of a first pixel-driving circuit of the display module in the first embodiment of the present application.
Figure 3:
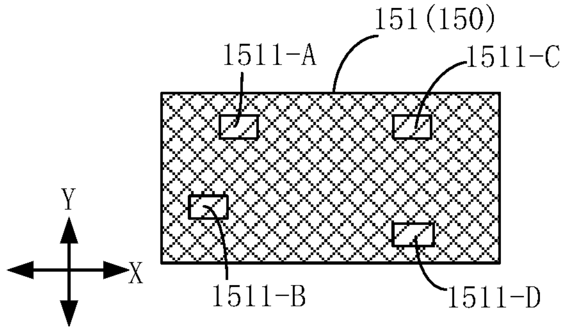
FIG. 3 is a plan diagram of first terminals in a first terminal module in the first embodiment of the present application.

FIG. 2 is an equivalent circuit diagram of a first pixel-driving circuit of the display module in the first embodiment of the present application. FIG. 3 is a plan diagram of first terminals in a first terminal module in the first embodiment of the present application. Combined with FIG. 1-FIG. 3, in some embodiments of the present application, the number of the first terminal group 151 in the first terminal module 150 is one. In the first terminal group 151, connecting lines from a center of one of the plurality of first terminals 1511 to centers of other two of the plurality of first terminals 1511 are parallel to a first direction X and a second direction Y respectively. The first direction X is perpendicular to the second direction Y.

In the display modules 100 provided by the present application, since in the first terminal group 151, the connecting lines from the center of one of the plurality of first terminals 1511 to the centers of the the other two of the plurality of first terminals 1511 are parallel to the first direction X and the second direction Y respectively, and the first direction X is perpendicular to the second direction Y. Therefore, the display module 100 may be applied in the display panel 10 as an independent unit, so that a bonding difficulty between the display module 100 and the driving backplate 200 in the display panel 10 is greatly reduced, a design difficulty of wirings of the driving backplate 200 is reduced, and it is easy to determine an arrangement direction of the display module 100 through a plurality of first bonding terminals in the first terminal group 151, so as to improve an assembly efficiency of the display module 100.

Continuing to refer to FIG. 2 and FIG. 3, in some embodiments of the present application, the plurality of first terminals 1511 in the first terminal group 151 include a data line terminal 1511-A, a scanning line terminal 1511-B, a first power signal terminal 1511-C, and a second power signal terminal 1511-D. In the first terminal group 151, a connecting line from a center of the first power signal terminal 1511-C to a center of the data line terminal 1511-A is parallel to the first direction X. A connecting line from the center of the first power signal terminal 1511-C to a center of the second power signal terminal 1511-D is parallel to the second direction Y.

In the present application, the connecting line from the center of the first power signal terminal 1511-C to the center of the data line terminal 1511-A is parallel to the first direction X. The connecting line from the center of the first power signal terminal 1511-C to the center of the second power signal terminal 1511-D is parallel to the second direction Y, so that the arrangement direction of the display module 100 may be determined by the first power signal terminal 1511-C, the data line terminal 1511-A, and the second power signal terminal 1511-D, the bonding difficulty between the display module 100 and the driving backplate 200 in the display panel 10 is greatly reduced, and the design difficulty of the wirings of the driving backplate 200 is reduced.

For example, in the display module 100 provided by the present application, the light-emitting unit 131 is driven by only one of the first pixel-driving circuit 121 corresponding to the light-emitting unit 131. The first pixel-driving circuit 121 is 2T1C pixel-driving circuit. The first pixel-driving circuit 121 includes a first thin film transistor T1, a second thin film transistor T2, and a first capacitor C1. The first terminal group 151 includes four first terminals, and the four first terminals are respectively the data line terminal 1511-A, the scanning line terminal 1511-B, the first power signal terminal 1511-C, and the second power signal terminal 1511-D. The display panel 10 includes the driving backplate 200. The driving backplate 200 includes a data line DATA, a scanning line SCAN, a first power line VDD, and a second power line VSS. The data line terminal 1511-A is electrically connected with the data line DATA. The scanning line terminal 1511-B is electrically connected with the scanning line SCAN. The first power signal terminal 1511-C is electrically connected with the first power line VDD. The second power signal terminal 1511-D is electrically connected with the second power line VSS.

Figure 4:
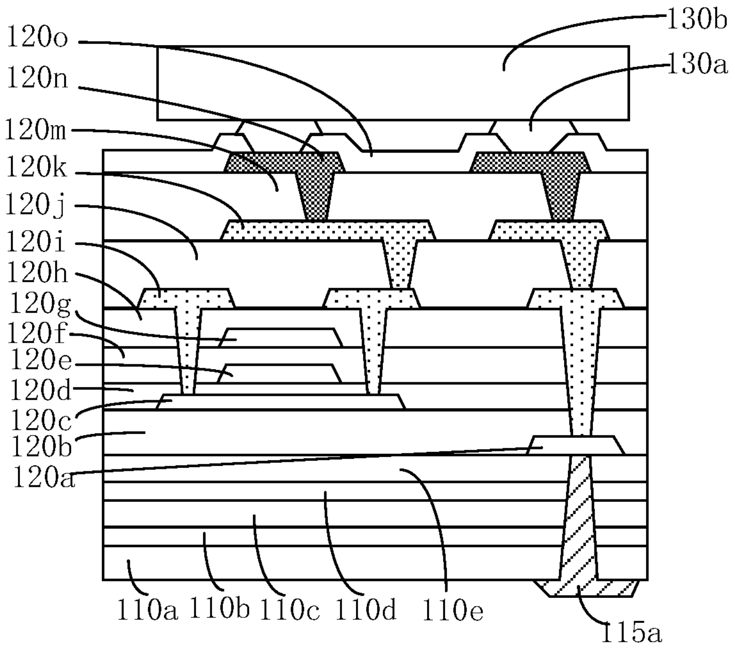
FIG. 4 is a schematic diagram of a film structure of a first substrate, a first pixel-driving circuit module, and a light-emitting module of the display module in the first embodiment of the present application.

FIG. 4 is a schematic diagram of a film structure of the first substrate, the first pixel-driving circuit module, and the light-emitting module of the display module in the first embodiment of the present application. Referring to FIG. 4, the first terminal module 150 is located in a first metal layer 115*a*. The first substrate 110 includes a first buffer layer 110*a*, a first substrate layer 110*b*, a first barrier layer 110*c*, a second substrate layer 110*d*, a second barrier layer 110*e*, which are sequentially stacked in a direction away from the first metal layer 115*a*. The plurality of first via holes 111 penetrate through the first buffer layer 110*a*, the first substrate layer 110*b*, the first barrier layer 110*c*, the second substrate layer 110*d*, and the second barrier layer 110*e*. The first pixel-driving circuit module 120 includes a shading metal layer 120*a*, a second buffer layer 120*e*, a semiconductor layer 120*c*, a first gate insulation layer 120*d*, a first gate layer 120*e*, a second gate insulation layer 120*f*, a second gate layer 120*g*, an interlayer insulation layer 120*h*, a first source-drain metal layer 120*i*, a first flat layer 120*j*, a second source-drain metal layer 120*k*, a second flat layer 120*m*, an electrode layer 120*n*, and a protective layer 120*o*, which are sequentially stacked in a direction of the second barrier layer 110*e* away from the second substrate layer 110*d*. The light-emitting module 130 includes a pad layer 130*a* and a light-emitting function layer 130*b*, which are sequentially stacked in a direction of the protective layer 120*o* away from the electrode layer 120*n*. The light-emitting function layer 130*b* is used to form the light-emitting unit 131.

Figure 5:
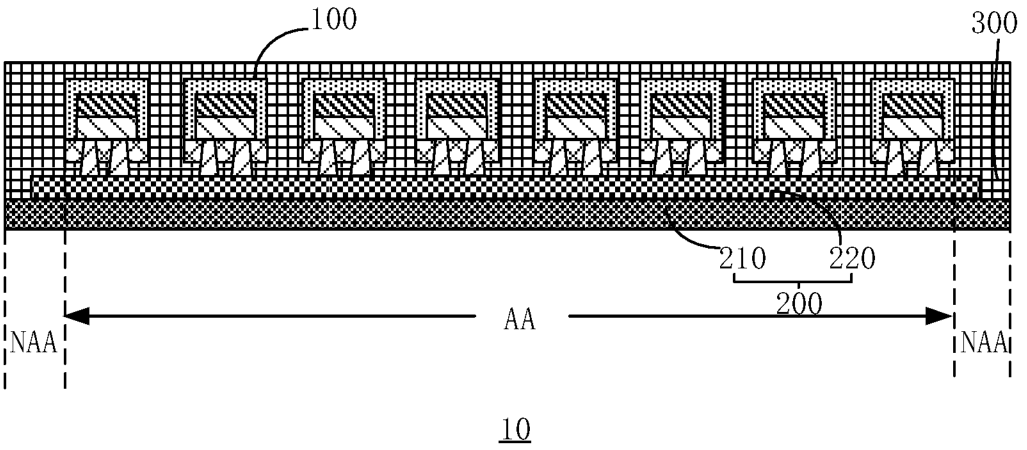
FIG. 5 is a schematic diagram of a film structure of a display panel in the first embodiment of the present application.
Figure 6:
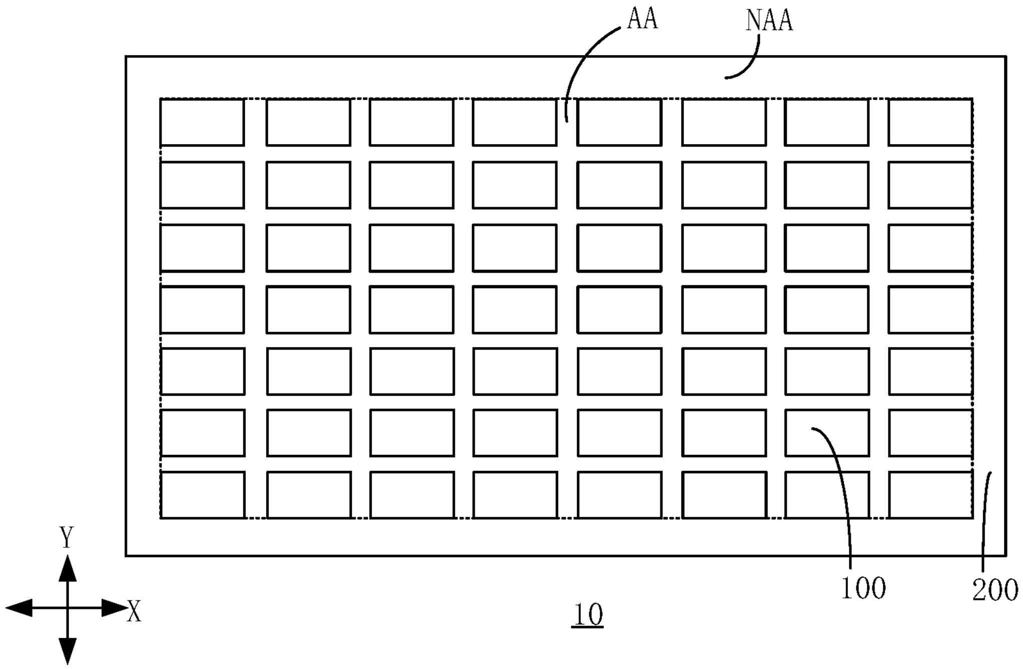
FIG. 6 is a plan diagram of the display modules of the display panel in the first embodiment of the present application.

FIG. 5 is a schematic diagram of a film structure of a display panel in the first embodiment of the present application. FIG. 6 is a plan diagram of the display modules of the display panel in the first embodiment of the present application. Referring to FIG. 5 and FIG. 6, in a second aspect, the first embodiment of the present application further provides the display panel 10. The display panel 10 includes a display area AA and a non-display area NAA. The display panel 10 includes the driving backplate 200 and the plurality of display modules 100 above-mentioned. The plurality of display modules 100 are arranged on a side of the driving backplate 200 in array and located in the display area AA. The driving backplate 200 includes a substrate 210 and a wiring layer 220 disposed on a side of the substrate 210. The plurality of display modules 100 are disposed on a side of the wiring layer 220 away from the substrate 210. The wiring layer 220 includes a plurality of first wirings (not shown in the figures) electrically connected with the first pixel-driving circuit 121 through the plurality of first terminals 1511. A thickness of the wiring layer 220 is larger than or equal to 10 μm.

Specifically, in a prior art, the wiring layer 220 and the pixel-driving circuit are sequentially stacked on a same substrate 210, so that the wiring layer 220 may merely be manufactured by a film-forming process, an exposure process, a development process, and an etching process. A thickness of the wirings formed by those processes is very limited, and a maximum thickness of the wirings may merely reach 1 μm, resulting in a large resistance of the metal wirings and a problem of uneven brightness of the display panel 10.

In the display panel 10 in the embodiment of the present application, since the wiring layer 220 is integrated into the driving backplane 200, the driving backplane 200 may be manufactured separately from the display modules 100. Therefore, the wiring layer 220 and the first pixel-driving circuit 121 may be formed by different processes. For example, the wiring layer 220 with a larger thickness may be formed by a thick metal preparation process such as an electroplating process, an electroless plating process, or a printing process, thereby greatly reducing a resistance of the first wirings, improving the problem of uneven brightness of the display panel 10, and improving the display quality of the display panel 10. Optionally, the thickness of the wiring layer 220 of the display panel 10 is greater than or equal to 10 μm, such as 10 μm, 13 μm, 15 μm, 18 μm, or 20 μm.

Furthermore, the first terminals 1511 of the display modules 100 are electrically connected with the first wirings of the driving backplane 200 by welding. For example, the display modules 100 are welded on the driving backplane 200 by Surface mounted technology (SMT), so that the first wirings are electrically connected with the first pixel-driving circuit 121 through the first terminals 1511.

In the present application, welding positions may be freely selected, so that the display modules 100 are disposed in any area corresponding to the display area AA of the driving backplate 200 to improve the design freedom of the display panel 10.

In some embodiments of the present application, the display panel 10 further includes a sealing structure layer 300. The sealing structure layer 300 is disposed on a side of the driving backplate 200 facing the display modules 100, and the sealing structure layer 300 covers the wiring layer 220 and the display modules 100.

Embodiment 2

The second embodiment of the present application provides a display module and a display panel.

Figure 7:
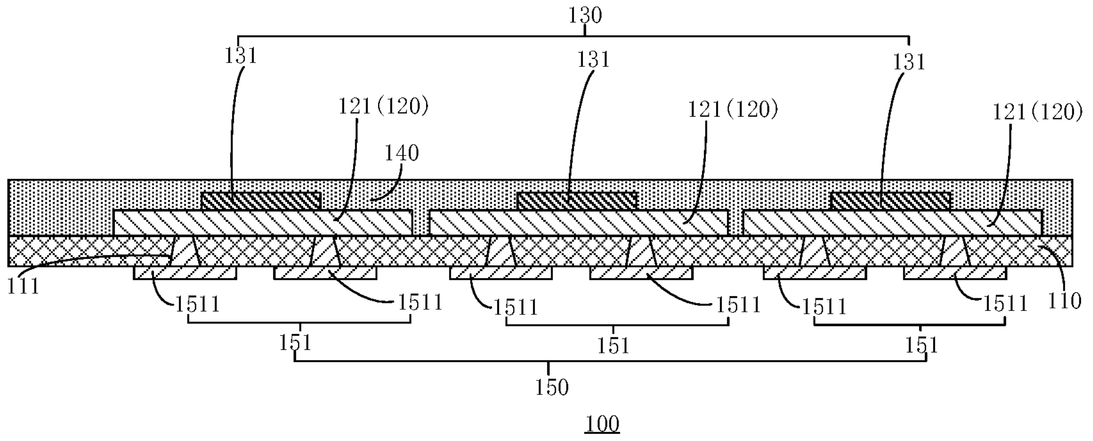
FIG. 7 is a schematic diagram of a film structure of a display module in a second embodiment of the present application.

FIG. 7 is a schematic diagram of a film structure of a display module in a second embodiment of the present application. Referring to FIG. 7, a display module 100 includes a first substrate 110, a first pixel-driving circuit module 120, a light-emitting module 130, and a first packaging structure 140. The first pixel-driving circuit module 120 is disposed on a side of the first substrate 110, and including at least one first pixel-driving circuit 121. The light-emitting module 130 is disposed on a side of the first pixel-driving circuit module 120 away from the first substrate 110, and including at least one light-emitting unit 131 corresponding to the first pixel-driving circuit 121. The first packaging structure 140 is disposed on a side of the first substrate 110 facing the first pixel-driving circuit module 120, and covering the first pixel-driving circuit module 120 and the light-emitting module 130. The display module 100 further includes a first terminal module 150. The first terminal module 150 is disposed on a side of the first substrate 110 away from the first pixel-driving circuit module 120, and including at least one first terminal group 151. The first terminal group 151 corresponds to the first pixel-driving circuit 121. The first terminal group 151 includes a plurality of first terminals 1511. The first substrate 110 is provided with a plurality of first via holes 111. The plurality of first terminals 1511 in the first terminal group 151 are electrically connected with the first pixel-driving circuit 121 through the plurality of first via holes 111.

Structures of the display module 100 and the display panel 10 provided by the second embodiment of the present application are similar to structures of the display module 100 and the display panel 10 provided by the first embodiment of the present application, and the second embodiment of the present application will not be repeated with respect to same parts.

There are differences in that, in the display module 100, the first pixel-driving circuit module 120 includes a plurality of first pixel-driving circuits 121, and the first terminal module 150 includes a plurality of first terminal groups 151.

Specifically, in the display module 100 provided by the embodiment of the present application, since the first pixel-driving circuit module 120 includes the plurality of first pixel-driving circuits 121, and the plurality of first pixel-driving circuits 121 correspond to the light-emitting units 131. Therefore, the display module 100 includes the plurality of first pixel-driving circuits 121 and a plurality of light-emitting units 131, so as to reduce an integration difficulty of the display module 100 and reduce manufacturing cost.

Figure 8:
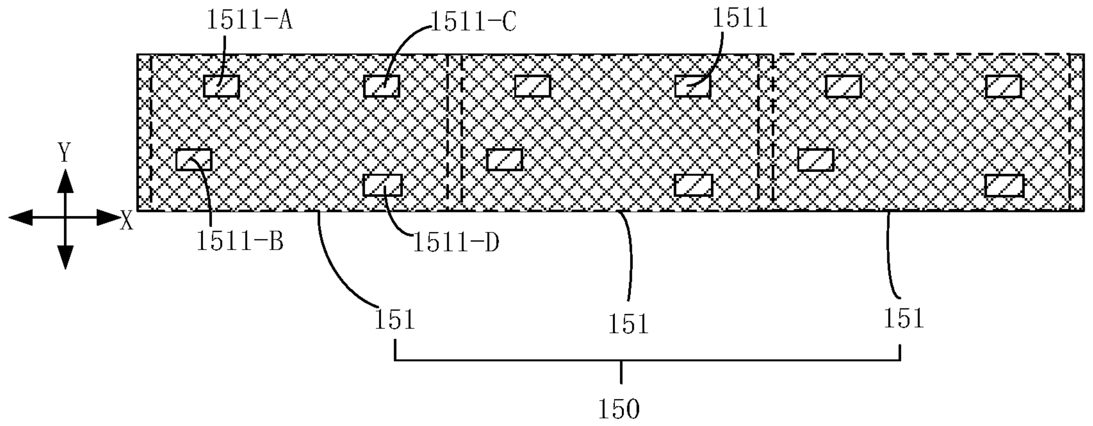
FIG. 8 is a plan diagram of first terminals in a first terminal module in the second embodiment of the present application.

FIG. 8 is a plan diagram of first terminals in a first terminal module in the second embodiment of the present application. Referring to FIG. 7 and FIG. 8, an arrangement of any kind of the plurality of first terminals 1511 in the plurality of first terminal groups 151 is same as an arrangement of the plurality of first pixel-driving circuits 121.

Continue to refer to FIG. 8, since the arrangement of any kind of the plurality of first terminals 1511 in the plurality of first terminal groups 151 is same as the arrangement of the plurality of first pixel-driving circuits 121, so the plurality of first terminals 1511 in the display module 100 may be arranged in an array by taking the first terminal groups 151 as a unit. Specifically, each of the first terminal groups 151 includes four kinds of the first terminals 1511, which are respectively a data line terminal 1511-A, a scanning line terminal 1511-B, a first power signal terminal 1511-C, and a second power signal terminal 1511-D.

Embodiment 3

The third embodiment of the present application provides a display module and a display panel.

Figure 9:
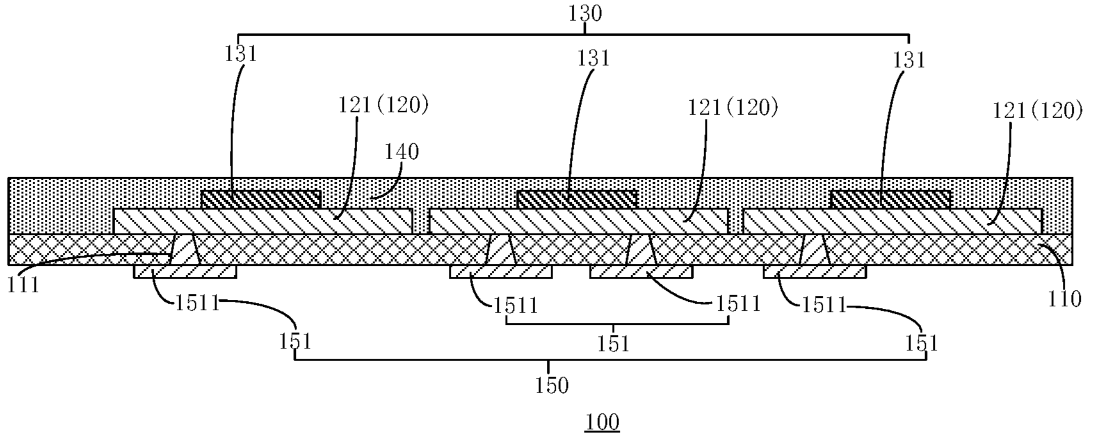
FIG. 9 is a schematic diagram of a film structure of a display module in a third embodiment of the present application.

FIG. 9 is a schematic diagram of a film structure of a display module in a third embodiment of the present application. Referring to FIG. 9, a display module 100 includes a first substrate 110, a first pixel-driving circuit module 120, a light-emitting module 130, and a first packaging structure 140. The first pixel-driving circuit module 120 is disposed on a side of the first substrate 110, and including at least one first pixel-driving circuit 121. The light-emitting module 130 is disposed on a side of the first pixel-driving circuit module 120 away from the first substrate 110, and including at least one light-emitting unit 131 corresponding to the first pixel-driving circuit 121. The first packaging structure 140 is disposed on a side of the first substrate 110 facing the first pixel-driving circuit module 120, and covering the first pixel-driving circuit module 120 and the light-emitting module 130. The display module 100 further includes a first terminal module 150. The first terminal module 150 is disposed on a side of the first substrate 110 away from the first pixel-driving circuit module 120, and including at least one first terminal group 151. The first terminal group 151 corresponds to the first pixel-driving circuit 121. Each of the first terminal group 151 includes a plurality of first terminals 1511. The first substrate 110 is provided with a plurality of first via holes 111. The plurality of first terminals 1511 in the first terminal group 151 are electrically connected with the first pixel-driving circuit 121 through the plurality of first via holes 111.

Structures of the display module 100 and the display panel 10 provided by the third embodiment of the present application are similar to structures of the display module 100 and the display panel 10 provided by the second embodiment of the present application. For example, in the display module 100, the first pixel-driving circuit module 120 includes a plurality of first pixel-driving circuits 121, and the first terminal module 150 includes a plurality of first terminal groups 151. The third embodiment of the present application will not be repeated with respect to same parts.

Figure 10:
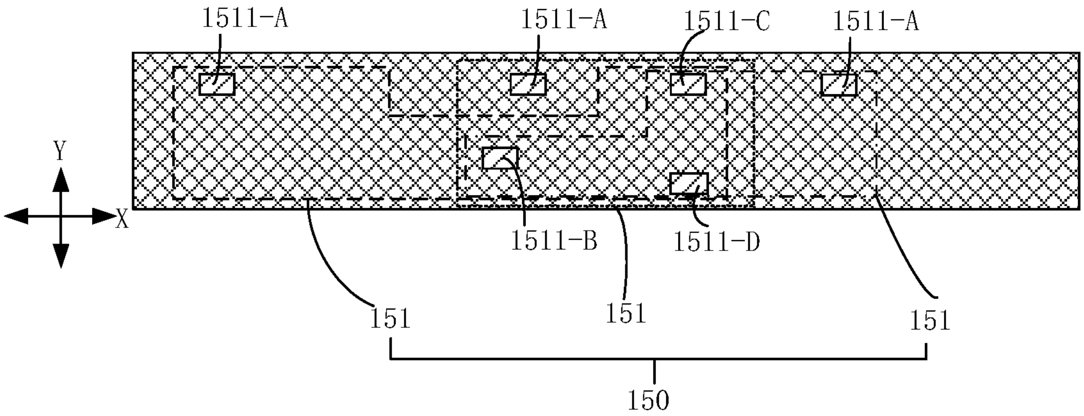
FIG. 10 is a plan diagram of first terminals in a first terminal module in the third embodiment of the present application.

FIG. 10 is a plan diagram of first terminals in a first terminal module in the third embodiment of the present application. Referring to FIG. 10, there are differences in that, an arrangement of at least one kind of the plurality of first terminals 1511 in the plurality of first terminal groups 151 is different from an arrangement of the plurality of first pixel-driving circuits 121.

In the display module 100 provided by the embodiment of the present application, since the arrangement of at least one kind of the plurality of first terminals 1511 in the plurality of first terminal groups 151 is different from the arrangement of the plurality of first pixel-driving circuits 121, so that at least one of the first terminals 1511 in one of the first terminal groups 151 are shared by other first terminal groups 151, thereby reducing a number of the first terminals 1511 and reducing a bonding difficulty of the display module 100.

Specifically, the light-emitting module 130 includes the plurality of light-emitting units 131 arranged at intervals along a same direction and having different light-emitting colors. The plurality of light-emitting units 131 arranged at intervals along the same direction and having different light-emitting colors are respectively electrically connected to the plurality of first pixel-driving circuits 121 arranged at intervals along the same direction. The plurality of first terminal groups 151 corresponding to the plurality of first pixel-driving circuits arranged at intervals along the same direction share at least one of the plurality of first terminals 1511.

Optionally, the light-emitting module 130 includes three light-emitting units 131 arranged at intervals along the first direction X and having different light-emitting colors. The three light-emitting units 131 arranged at intervals along the first direction X and having different light-emitting colors are respectively electrically connected to the plurality of first pixel-driving circuits 121 arranged at intervals along the first direction X. The plurality of first terminal groups 151 corresponding to the plurality of first pixel-driving circuits arranged at intervals along the first direction X share at least one of the plurality of first terminals 1511.

Specifically, the plurality of first terminal groups 151 corresponding to the plurality of first pixel-driving circuits 121 arranged at intervals along the same direction share one scanning line terminal 1511-B, one first power signal terminal 1511-C, and one second power signal terminal 1511-D. That is, the plurality of first terminal groups 151 corresponding to the plurality of first pixel-driving circuits 121 arranged at intervals along the same direction share three first terminals 1511, thereby greatly reducing a number of the first terminals 1511 in the display module 100 and reducing the bonding difficulty of the display module 100.

Furthermore, an arrangement of data line terminals 1511-A in each of the plurality of first terminal groups is same as an arrangement of the plurality of first pixel-driving circuits 121.

Embodiment 4

The fourth embodiment of the present application provides a display module and a display panel.

Figure 11:
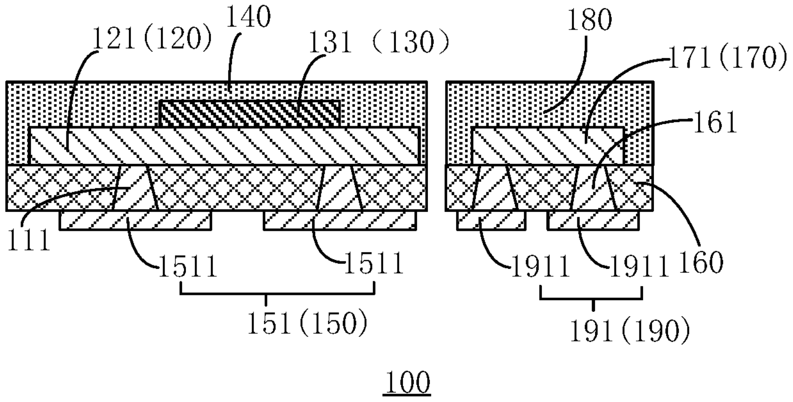
FIG. 11 is a schematic diagram of a film structure of a display module in a fourth embodiment of the present application.

FIG. 11 is a schematic diagram of a film structure of a display module in a fourth embodiment of the present application. Referring to FIG. 11, a display module 100 includes a first substrate 110, a first pixel-driving circuit module 120, a light-emitting module 130, and a first packaging structure 140. The first pixel-driving circuit module 120 is disposed on a side of the first substrate 110, and including at least one first pixel-driving circuit 121. The light-emitting module 130 is disposed on a side of the first pixel-driving circuit module 120 away from the first substrate 110, and including at least one light-emitting unit 131 corresponding to the first pixel-driving circuit 121. The first packaging structure 140 is disposed on a side of the first substrate 110 facing the first pixel-driving circuit module 120, and covering the first pixel-driving circuit module 120 and the light-emitting module 130. The display module 100 further includes a first terminal module 150. The first terminal module 150 is disposed on a side of the first substrate 110 away from the first pixel-driving circuit module 120, and including at least one first terminal group 151. The first terminal group 151 corresponds to the first pixel-driving circuit 121. The first terminal group 151 includes a plurality of first terminals 1511. The first substrate 110 is provided with a plurality of first via holes 111. The plurality of first terminals 1511 in the first terminal group 151 are electrically connected with the first pixel-driving circuit 121 through the plurality of first via holes 111.

Structures of the display module 100 and the display panel 10 provided by the fourth embodiment of the present application is similar to structures of the display module 100 and the display panel 10 provided by the first embodiment of the present application. The fourth embodiment of the present application will not be repeated with respect to same parts.

There are differences in that, the display module 100 includes a second substrate 160, a second pixel-driving circuit module 170, and a second packaging structure 180. The second pixel-driving circuit module 170 is disposed on a side of the second substrate 160, and including at least one second pixel-driving circuit 171. The second packaging structure 180 is disposed on a side of the second substrate 160 facing the second pixel-driving circuit module 170, and covering the second pixel-driving circuit module 170. The display module 100 further includes a second terminal module 190. The second terminal module 190 is disposed on a side of the second substrate 160 away from the second pixel-driving circuit module 170, and including at least one second terminal group 191 corresponding to the second pixel-driving circuit 171. The second terminal group 191 includes a plurality of second terminals 1911. The second substrate 160 is provided with a plurality of second via holes 161. The plurality of second terminals 1911 in the second terminal group 191 are electrically connected with the second pixel-driving circuit 171 through the plurality of second via holes 161. The first pixel-driving circuit 121 corresponds to the second pixel-driving circuit 171, and the first pixel-driving circuit 121 and at least second pixel-driving circuit 171 corresponding to the first pixel-driving circuit 121 are used to drive the light-emitting unit 131.

In the display module 100 provided by the present application, the first pixel-driving circuit 121 corresponds to the second pixel-driving circuit 171, and the first pixel-driving circuit 121 and the second pixel-driving circuit 171 corresponding to the first pixel-driving circuit 121 are used to drive the light-emitting unit 131. That is, the first pixel-driving circuit 121 and the second pixel-driving circuit 171 jointly drive the light-emitting unit 131, and together constitute a complete pixel-driving circuit to drive the same light-emitting unit 131 to emit light.

In the display module 100 provided by the present application, since the display module 100 further includes the second substrate 160 disposed separately from the first substrate 110, the second pixel-driving circuit module 170 and the second package structure 180 are sequencely stacked on a side of the second substrate 160, and the second terminal module 190 is disposed on other side of the second substrate 160, so that the second terminal module 190 may be disposed separately from the first terminal module 150. Therefore, when a structure of the pixel-driving circuit is complex and a number of the terminals is large, by providing the second pixel-driving circuit module 170 separated from the first pixel-driving circuit module 120 and the second terminal module 190 separated from the first terminal module 150, a design complexity and the bonding difficulty of the display module 100 may be reduced.

Furthermore, in the display module 100, a number of the first-pixel driving circuit 121, a number of the second pixel driving circuit 171, and a number of the light-emitting unit 131 are all one.

Figure 12:
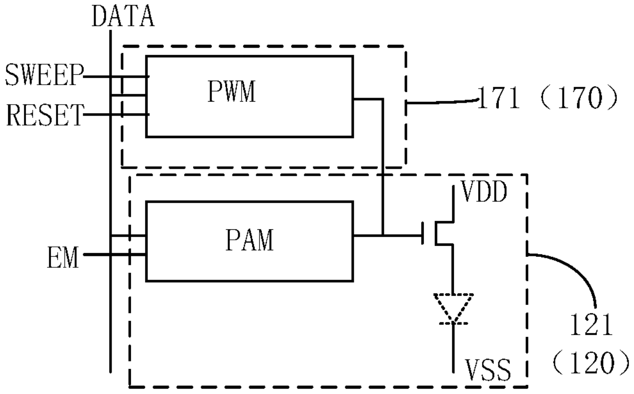
FIG. 12 is an equivalent circuit diagram of a first pixel-driving circuit module and a second pixel-driving circuit module of the display module in the fourth embodiment of the present application.

FIG. 12 is an equivalent circuit diagram of a first pixel-driving circuit module and a second pixel-driving circuit module of the display module in the fourth embodiment of the present application. Referring to FIG. 12, a driving mode of the first pixel-driving circuit 121 is pulse amplitude modulation, and a driving mode of the second pixel-driving circuit 171 is pulse width modulation.

When the display module 100 is applied in the display panel 10, the display panel 10 includes a driving backplate 200. The driving backplate 200 includes a data line DATA, a scanning line SWEEP, a reset line RESET, an enable signal line EM, a first power line VDD, and a second power line VSS. The first pixel-driving circuit 121 is electrically connected with the data line DATA, the scanning line SWEEP, and the reset line RESET. The second pixel-driving circuit 171 is electrically connected with the data line DATA, the enable signal line EM, the first power line VDD, and the second power line VSS.

Embodiment 5

Figure 13:
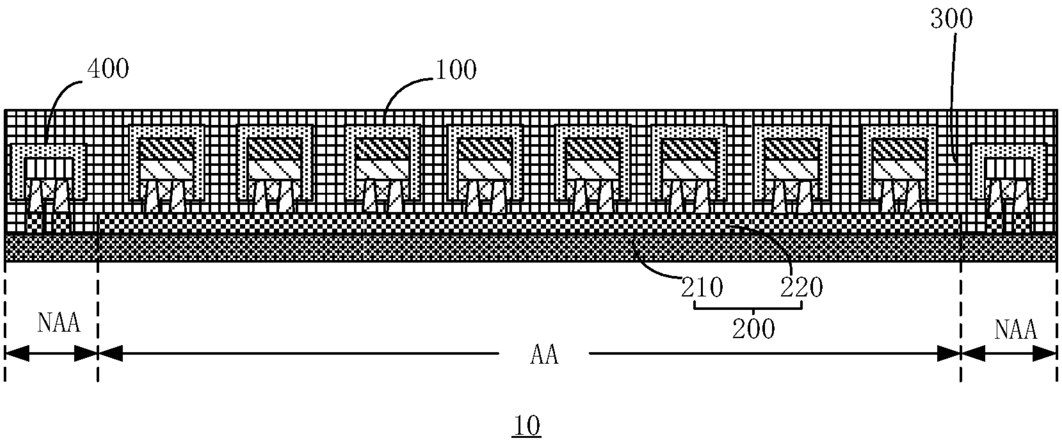
FIG. 13 is a schematic diagram of a film structure of a display module in a fifth embodiment of the present application.
Figure 14:
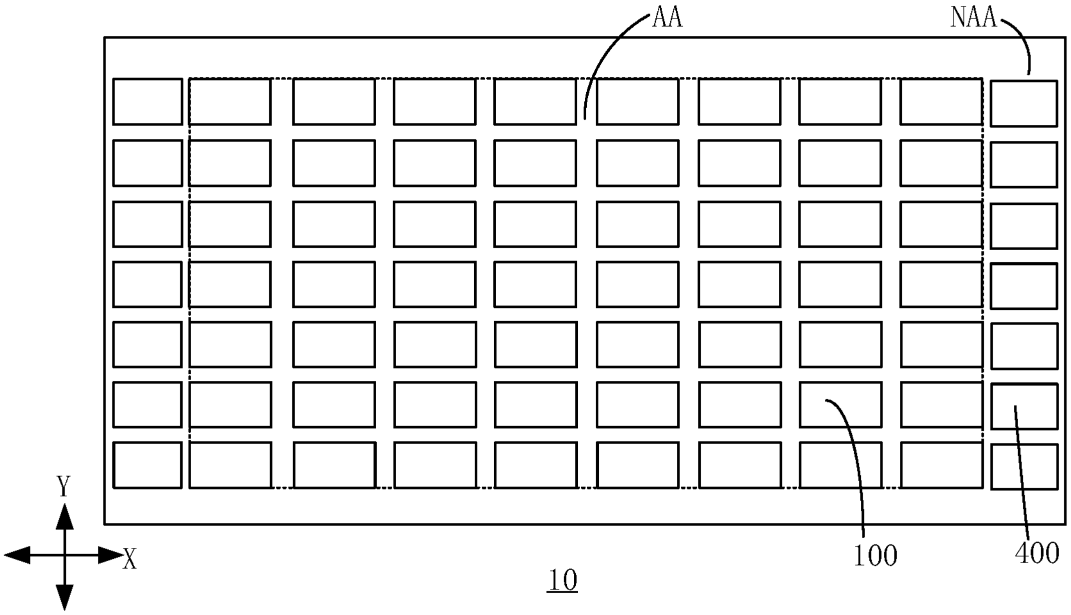
FIG. 14 is a plan diagram of display modules and gate driving circuits in the fifth embodiment of the present application.
Figure 15:
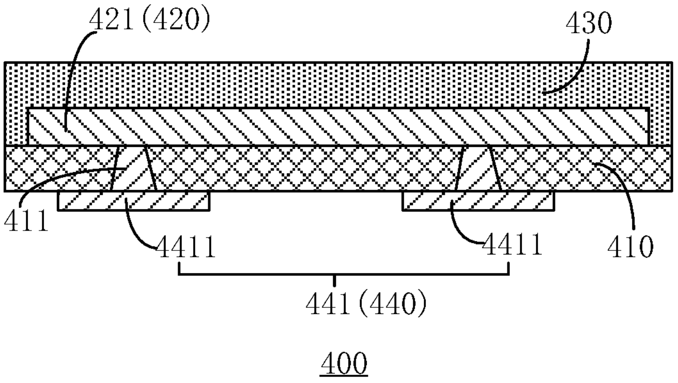
FIG. 15 is a schematic diagram of a film structure of the gate driving circuits in the fifth embodiment of the present application.

FIG. 13 is a schematic diagram of a film structure of a display module in a fifth embodiment of the present application. FIG. 14 is a plan diagram of display modules and gate driving circuits in the fifth embodiment of the present application. FIG. 15 is a schematic diagram of a film structure of the gate driving circuits in the fifth embodiment of the present application. Referring to FIG. 13-FIG. 15, the fifth embodiment of the present application provides a display panel 10. The display panel 10 includes a display area AA and a non-display area NAA. The display panel 10 includes the driving backplate 200 and the plurality of display modules 100 in any one of the embodiments 1 to embodiments 4. The plurality of display modules 100 are arranged on a side of the driving backplate 200 in array and located in the display area AA. The driving backplate 200 includes a substrate 210 and a wiring layer 220 disposed on a side of the substrate 210. The plurality of display modules 100 are disposed on a side of the wiring layer 220 away from the substrate 210. The wiring layer 220 includes a plurality of first wirings electrically connected with the first pixel-driving circuit 121 through the plurality of first terminals 1511. A thickness of the wiring layer 220 is larger than or equal to 10 μm.

In some embodiments of the present application, the display panel 10 further includes a plurality of gate driving modules 400, and the plurality of gate driving modules 400 are arranged on a side of the driving backplate 200 facing the plurality of display modules 100 in array and located in the non-display area NAA. The plurality of gate driving modules 400 includes a third substrate 410, and a gate driving circuit module 420, a third packaging structure 430. The gate driving circuit module 420 is disposed on a side of the third substrate 410, and including at least one gate driving circuit 421. The third packaging structure 430 is disposed on a side of the third substrate 410 facing the gate driving circuit module 420, and covering the gate driving circuit module 420. The plurality of gate driving modules 400 further includes a third terminal module 440 disposed on a side of the third substrate 410 away from the gate driving circuit module 420, and the plurality of gate driving modules 400 include at least one third terminal group 441 corresponding to the gate driving circuit 421. The third terminal group 441 includes a plurality of third terminals 4411. The third substrate 410 is provided with a plurality of third via holes 411. The plurality of third terminals 4411 in the third terminal group 441 are electrically connected with the gate driving circuit 421 through the plurality of third via holes 411.

In the present application, the plurality of gate driving modules 400 are disposed separately from each other in the non-display area NAA, so that the gate driving circuit 421 in the display panel 10 may 10 may be freely disposed as an independent unit in any area of the non-display area NAA, thereby greatly reducing the development cost of the display panel 10.

Figure 16:
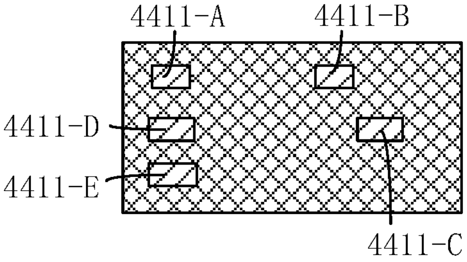
FIG. 16 is a plan diagram of third terminals in the third terminal module in the fifth embodiment of the present application.

FIG. 16 is a plan diagram of third terminals in the third terminal module in the fifth embodiment of the present application. Referring to FIG. 16, in some embodiments of the present application, in the first terminal group 441, connecting lines from a center of one of the plurality of third terminals 441 to centers of other two of the plurality of third terminals 4411 are parallel to a first direction X and a second direction Y respectively, and the first direction X is perpendicular to the second direction Y.

In the gate driving modules 400 provided by the present application, since in the first terminal group 441, connecting lines from the center of one of the plurality of third terminals 441 and the centers of the other two of the plurality of third terminals 4411 are parallel to the first direction X and the second direction Y respectively, and the first direction X is perpendicular to the second direction Y. Therefore, the gate driving modules 400 may be applied in the display panel 10 as the independent unit, so that the bonding difficulty of the display module 100 between the gate driving modules 400 and the backplate 200 of the display panel 10 is greatly reduced, a wiring design difficulty of the backplate 200 is reduced, an arrangement direction of the display module 100 is easily determined through a plurality of third bonding terminals in the third terminal groups 441, and an assembly efficiency of the display module 100 is improved.

Specifically, in the third terminal group 441, the plurality of third terminals 4411 include a clock signal terminal 4411-A, a first scanning signal terminal 4411-B, a second signal terminal 4411-C, a VGH signal terminal 4411-D, and a VGL signal terminal 4411-E. In the third terminal group 441, a connecting line between a center of the clock signal terminal 4411-A, a center of the VGH signal terminal 4411-D, and a center of the VGL signal terminal 4411-E is parallel to the second direction Y. A connecting line from the center of the clock signal terminal 4411-A to a center of the first scanning signal terminal 4411-B is parallel to the first direction X.

In some embodiments of the present application, the gate driving circuit module 420 includes a plurality of gate driving circuits 421. The third terminal module 440 includes a plurality of third terminal groups 441. An arrangement of any kind of the plurality of third terminals 4411 in the plurality of third terminal groups 441 is same as an arrangement of a plurality of gate driving circuit modules 420.

In the gate driving modules 400 provided by the present application, the gate driving circuit module 420 includes the plurality of gate driving circuits 421, and the third terminal module 440 includes the plurality of third terminal groups 441, thereby reducing an integration difficulty of the gate driving circuit module 420, and reducing the manufacturing cost.

Since the arrangement of any kind of the plurality of third terminals 4411 in the plurality of third terminal groups 441 is same as the arrangement of a plurality of gate driving circuit modules 420. Therefore, each of the plurality of third terminals 4411 in the gate driving circuit module 420 may be arrayed by taking the third terminal groups 441 as a unit, thereby further reducing the integration difficulty of the display module 100.

Certainly, in other embodiments of the present application, when the gate driving circuit module 420 includes the plurality of gate driving circuits 421, and the third terminal module 440 includes the plurality of third terminal groups 441 corresponding to the plurality of gate driving circuits 421, the arrangement of at least one kind of the plurality of third terminals 4411 in the plurality of third terminal groups 441 is different from the arrangement of the plurality of gate driving circuit modules 420, so that the kind of the plurality of third terminals 4411 in the plurality of third terminal groups 441 is shared by other third terminal groups 4411, thereby reducing a number of the plurality of third terminals 4411, and reducing the bonding difficulty of the display module.

Specifically, the plurality of gate driving circuits 421 corresponding to the plurality of third terminal groups 441 along a same direction share at least one kind of the plurality of third terminals 4411.

In some embodiments of the present application, the plurality of gate driving circuits 421 corresponding to the plurality of third terminal groups 441 along a same direction share one clock signal terminal 4411-A, one VGH signal terminal 4411-D, and one VGL signal terminal 4411-E.

In some embodiments of the present application, films forming the gate driving modules 400 are one of films in the display module 100, so that the gate driving modules 400 and the display modulse 100 may be manufactured at a same time, thereby reducing the manufacturing cost.

In some embodiments of the present application, the wiring layer 220 further includes a plurality of second wirings (not shown in the figures), and the plurality of second wirings are connected to the plurality of gate driving circuits 421 through the plurality of third terminals 4411.

In some embodiments of the present application, the display panel 10 further includes a sealing structure layer 300. The sealing structure layer 300 is disposed on a side of the driving backplate 200 facing the display modules 100, and the sealing structure layer 300 covers the wiring layer 220, the display modules 100, and the gate driving modules 400.

In summary, the present application provides the display module and the display panel. The display module includes the first substrate, the first pixel-driving circuit module, the light-emitting module, and the first packaging structure. The first pixel-driving circuit module is disposed on the side of the first substrate, and including at least one first pixel-driving circuit. The light-emitting module disposed on the side of the first pixel-driving circuit module away from the first substrate, and including at least one light-emitting unit corresponding to the first pixel-driving circuit. The first packaging structure disposed on the side of the first substrate facing the first pixel-driving circuit module, and covering the first pixel-driving circuit module and the light-emitting module. The display module further includes the first terminal module. The first terminal module disposed on the side of the first substrate away from the first pixel-driving circuit module, and including at least one first terminal group corresponding to the first pixel-driving circuit. The first terminal group includes a plurality of first terminals. The first substrate is provided with the plurality of first via holes, and the plurality of first terminals in the first terminal group are electrically connected with the first pixel-driving circuit through the plurality of first via holes. In the present application, by taking the display module as a unit, the pixel-driving circuit as an independent unit may be freely disposed in any area of the display area of the display panel, thereby greatly reducing development cost of the display panel.

The display module and the display panel provided by the embodiments of the present application are described in detail above. The principle and implementations of the present application are described in this specification by using specific examples. The descriptions about the foregoing embodiments is merely provided to help understand the method and core ideas of the present disclosure. In addition, persons of ordinary skill in the art can make modifications in terms of the specific implementations and application scopes according to the ideas of the present disclosure. Therefore, the content of this specification shall not be construed as a limit to the present application.

What is claimed is:

1. A display module, comprising:

a first substrate provided with a plurality of first via holes;

a first pixel-driving circuit module disposed on a side of the first substrate, and comprising at least one first pixel-driving circuit;

a light-emitting module disposed on a side of the first pixel-driving circuit module away from the first substrate, and comprising at least one light-emitting unit corresponding to the first pixel-driving circuit;

a first packaging structure, disposed on a side of the first substrate facing the first pixel-driving circuit module, and covering the first pixel-driving circuit module and the light-emitting module; and a first terminal module, disposed on a side of the first substrate away from the first pixel-driving circuit module, and comprising at least one first terminal group corresponding to the first pixel-driving circuit;

wherein the first terminal group comprises a plurality of first terminals electrically connected with the first pixel-driving circuit through the plurality of first via holes, and wherein in the first terminal group, connecting lines between a center of one of the plurality of first terminals and the centers of two other of the plurality of first terminals are parallel to a first direction and a second direction respectively, and the first direction is perpendicular to the second direction.

2. The display module according to claim 1, wherein in the first terminal group, the plurality of first terminals comprise a data line terminal, a scanning line terminal, a first power signal terminal, and a second power signal terminal; in the first terminal group, the connecting line from a center of the first power signal terminal to a center of the data line terminal is parallel to the first direction; and the connecting line from the center of the first power signal terminal to a center of the second power signal terminal is parallel to the second direction.

3. The display module according to claim 2, wherein the first pixel-driving circuit module comprises a plurality of first pixel-driving circuits, and the first terminal module comprises a plurality of first terminal groups corresponding to the plurality of first pixel-driving circuits;

an arrangement of any kind of the plurality of first terminals in the plurality of first terminal groups is same as an arrangement of the plurality of first pixel-driving circuits.

4. The display module according to claim 2, wherein the first pixel-driving circuit module comprises a plurality of first pixel-driving circuits, and the first terminal module comprises a plurality of first terminal groups corresponding to the plurality of first pixel-driving circuits;

an arrangement of any kind of the plurality of first terminals in the plurality of first terminal groups is different from an arrangement of the plurality of first pixel-driving circuits.

5. The display module according to claim 4, wherein the light-emitting module comprises a plurality of light-emitting units arranged at intervals along a same direction and having different light-emitting colors, and the plurality of light-emitting units arranged at intervals along the same direction and having different light-emitting colors are respectively electrically connected to the plurality of first pixel-driving circuits arranged at intervals along the same direction; the plurality of first terminal groups corresponding to the plurality of first pixel-driving circuits arranged at intervals along the same direction share at least one of the plurality of first terminals.

6. The display module according to claim 3, wherein the plurality of first terminal groups corresponding to the plurality of first pixel-driving circuits arranged at intervals along the same direction share one scanning line terminal, one first power signal terminal, and one second power signal terminal.

7. The display module according to claim 3, wherein an arrangement of data line terminals in each of the plurality of first terminal groups is same as an arrangement of the plurality of first pixel-driving circuits.

8. The display module according to claim 1, further comprising:

a second substrate provided with a plurality of second via holes;

a second pixel-driving circuit module disposed on a side of the second substrate, and comprising at least one second pixel-driving circuit;

a second packaging structure disposed on a side of the second substrate facing the second pixel-driving circuit module, and covering the second pixel-driving circuit module; and a second terminal module disposed on a side of the second substrate away from the second pixel-driving circuit module, and comprising at least one second terminal group corresponding to the second pixel-driving circuit;

wherein the second terminal group comprises a plurality of second terminals electrically connected with the second pixel-driving circuit through the plurality of second via holes;

the first pixel-driving circuit corresponds to the second pixel-driving circuit, and the first pixel-driving circuit and the second pixel-driving circuit correspondingly disposed are configured to driving the light-emitting unit.

9. The display module according to claim 8, wherein in the display module, a number of the first-pixel driving circuit, a number of the second pixel driving circuit, and a number of the light-emitting unit are all one.

10. The display module according to claim 8, wherein a driving mode of the first pixel-driving circuit is pulse amplitude modulation, and a driving mode of the second pixel-driving circuit is pulse width modulation.

11. A display panel provided with a display area and a non-display area, comprising:

a driving backplate; and a plurality of display modules disposed on a side of the driving backplate and located in the display area, each of the plurality of display modules comprising:

a first substrate provided with a plurality of first via holes;

a first pixel-driving circuit module disposed on a side of the first substrate, and comprising at least one first pixel-driving circuit;

a light-emitting module disposed on a side of the first pixel-driving circuit module away from the first substrate, and comprising at least one light-emitting unit corresponding to the first pixel-driving circuit;

a first packaging structure disposed on a side of the first substrate facing the first pixel-driving circuit module, and covering the first pixel-driving circuit module and the light-emitting module; and a first terminal module, disposed on a side of the first substrate away from the first pixel-driving circuit module, and comprising at least one first terminal group corresponding to the first pixel-driving circuit;

wherein the first terminal group comprises a plurality of first terminals electrically connected with the first pixel-driving circuit through the plurality of first via holes; and the driving backplate comprises:

a substrate; and a wiring layer disposed on a side of the substrate;

wherein the plurality of display modules are disposed on a side of the wiring layer away from the substrate; the wiring layer comprises a plurality of first wirings electrically connected with the first pixel-driving circuit through the plurality of first terminals; and a thickness of the wiring layer is larger than or equal to 10 μm.

12. The display panel according to claim 11, further comprising a plurality of gate driving modules arranged on a side of the driving backplate facing the plurality of display modules in array and located in the non-display area;

wherein the plurality of gate driving modules comprise:

a third substrate, provided with a plurality of third via holes;

a gate driving circuit module disposed on a side of the third substrate, and comprising at least one gate driving circuit;

a third packaging structure disposed on a side of the third substrate facing the gate driving circuit module, and covering the gate driving circuit module; and a third terminal module disposed on a side of the third substrate away from the gate driving circuit module, and comprising at least one third terminal group corresponding with the gate driving circuit;

wherein the third terminal group comprises a plurality of third terminals electrically connected with the gate driving circuit through the plurality of third via holes.

13. The display panel according to claim 12, wherein in the first terminal group, connecting lines from a center of one of the plurality of third terminals and centers of other two of the plurality of third terminals are parallel to a first direction and a second direction respectively, and the first direction is perpendicular to the second direction.

14. The display panel according to claim 13, wherein the plurality of third terminals in the third terminal group comprise a clock signal terminal, a first scanning signal terminal, a second signal terminal, a VGH signal terminal, and a VGL signal terminal; in the third terminal group, a connecting line from a center of the clock signal terminal to a center of the VGH signal terminal and a center of the VGL signal terminal is parallel to the second direction; and a connecting line from the center of the clock signal terminal to a center of the first scanning signal terminal is parallel to the first direction.

15. The display panel according to claim 12, wherein the gate driving circuit module comprises a plurality of gate driving circuits; the third terminal module comprises a plurality of third terminal groups; and an arrangement of any kind of the plurality of third terminals in the plurality of third terminal groups is same as an arrangement of a plurality of gate driving circuit modules.

16. The display panel according to claim 12, wherein the gate driving circuit module comprises a plurality of gate driving circuits, and the third terminal module comprises a plurality of third terminal groups corresponding to the plurality of gate driving circuits;

an arrangement of at least one kind of the plurality of third terminals in the plurality of third terminal groups is different from an arrangement of a plurality of gate driving circuit modules.

17. The display panel according to claim 12, wherein the plurality of gate driving circuits corresponding to the plurality of third terminal groups along a same direction share at least one kind of the plurality of third terminals.

18. The display panel according to claim 17, wherein the plurality of gate driving circuits corresponding to the plurality of third terminal groups along a same direction share one clock signal terminal, one VGH signal terminal, and one VGL signal terminal.

19. The display panel according to claim 12, wherein the wiring layer further comprises a plurality of second wirings, and the plurality of second wirings are connected to the of gate drive circuits through the plurality of third terminals.

* * * * *